3,268,779

PRINT OF DRAWING AS ORIGINALLY FILED

INVENTOR
THOMAS J. ROACH

BY

OSTROLENK, FABER, GERB & SOFFEN

ATTORNEYS

United States Patent Office 3,268,779

Patented August 23, 1966

3,268,779

HERMETICALLY SEALED SEMICONDUCTOR DEVICE

Thomas J. Roach, Palos Verdes Estates, Calif., assignor to International Rectifier Corporation, El Segundo, Calif., a corporation of California Filed Nov. 6, 1963, Ser. No. 321,857
5 Claims. (Cl. 317—234)

This invention relates to a novel arrangement for brazing of a hermetically sealed housing, and more specifically relates to the formation of a hermetically sealed housing for semiconductor-type devices.

The manufacture of semiconductor devices such as rectifiers and controlled rectifiers formed through the provision of various junctions in a wafer of semiconductor material are well-known to those skilled in the art. It is common practice to hermetically seal these devices in a suitable housing. In forming such hermetically sealed housings, it is necessary to provide a high strength seal which is gas-tight without applying excessive heat to the junction-containing wafer.

The principle of the present invention is to form a novel annular groove in the copper stud which centrally receives the junction-containing wafer and which must have the housing structure brazed thereto. This novel groove is placed immediately adjacent the area to be brazed, whereby it serves to remove portions of the copper heat sink from the brazing area so that the braze can be more efficiently made, and further serves to partially thermally insulate the semiconductor wafer from the heat source during the brazing operation.

Accordingly, a primary object of this invention is to provide a novel hermetically sealed housing for semiconductor devices.

Another object of this invention is to provide a novel copper structure which can be efficiently brazed.

Yet a further object of this invention is to configure the area of a conductive member to be brazed in such a manner that it does not serve as an efficient heat sink during the brazing operation.

A still further object of this invention is to thermally insulate a semiconductor wafer from the source of heat used during the brazing of a housing to the conductive support for the wafer.

These and other objects of this invention will become apparent from the following description when taken in connection with the drawings, in which.

Figure 1:
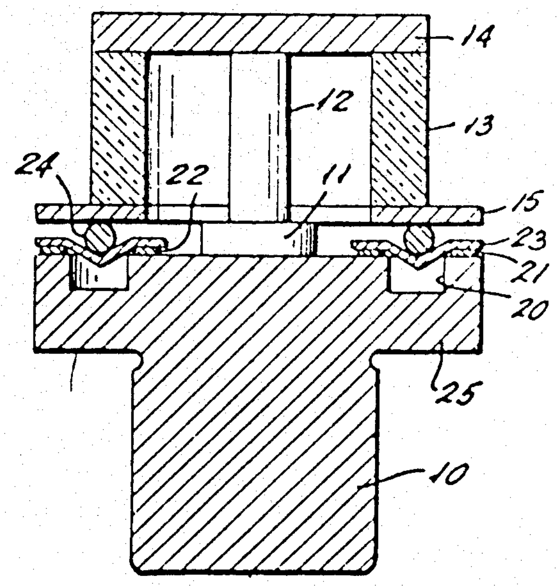
FIGURE 1 shows a cross-sectional view of a typical housing for a semiconductor device prior to brazing thereof wherein the copper stud is prepared in accordance with the invention.
Figure 2:
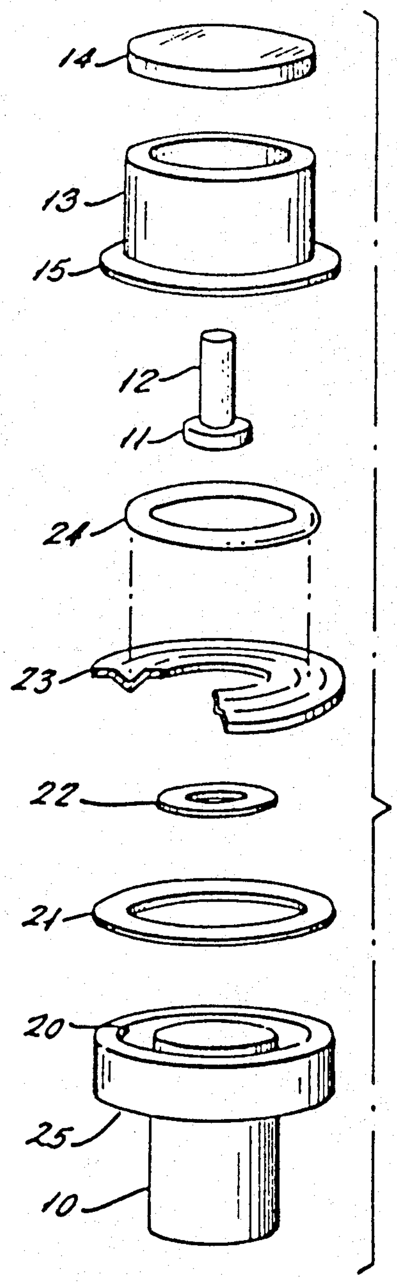
FIGURE 2 is an exploded perspective view of FIGURE 1.

Referring now to the figures, I have illustrated therein a typical semiconductor device and housing therefor which includes a copper stud 10 which has a suitable wafer assembly 11 connected thereto. The wafer assembly 11 may be of any desired type, and could, for example, include a wafer of silicon having one or more junctions therein with the upper and lower surfaces of the wafer having suitable electrode wafers connected thereto for their electrical connection on the bottom to the copper stud 10, and on the top to a suitable flexible conductor 12.

The housing for the wafer-containing device 11 is formed on one side by the base of stud 10 and is completed by a suitable ceramic cylinder 13 and an upper conductive cap 14 which is preassembled to the cylinder 13, and is electrically connected to pigtail 12. The lower end of cylinder 13 has a nickel-iron disk 15 preassembled thereto whereby it is necessary now to connect disk 15 to the copper stud 11 such that it surrounds and seals the interior volume surrounding device 11.

In accordance with the invention, a groove 20 is placed in stud 10 as illustrated. Two solder shims 21 and 22 are then placed adjacent the outer and inner diameter portions of groove 20 and receive a nickel-iron brazing disk 23 which has a V-shaped cross-section trough or projecting central section which projects toward the interior of groove 20. The V-shaped trough formed in section 23 then receives a solder ring 24 which then sits immediately under disk 15.

In order to now form the seal, a suitable A.-C. welder has its first electrode placed on the annular area above disk 15 and its other electrode on the under side of flange 25 of stud 10. An electric current is then caused to flow between the welder electrodes along with pressure which is applied by the welder electrodes to compress the assembly. Accordingly, shims 21 and 22 and ring 24 melt to braze together components adjacent these solder members.

It is to be specifically noted that the groove 20 serves to remove a large portion of the heat sink formed by stud 10 and adjacent disk 23. Therefore, heat is less readily conducted away from the brazing area so that the braze is made more efficiently. Moreover, since less heat can now enter the stud 11, less heat will be applied to the wafer-containing device 11 so that the wafer is protected from deterioration due to such heat.

Although this invention has been described with respect to its preferred embodiments, it should be understood that many variations and modifications will now be obvious to those skilled in the art, and it is preferred, therefore, that the scope of this invention be limited not by the specific disclosure herein but only by the appended claims.

The embodiments of the invention in which an exclusive privilege or property is claimed are defined as follows:

1. An annular brazed seal between a first and second conductive body; said brazed seal including an annular brazing ring interposed between said first and second conductive bodies; at least said first conductive body having an annular groove therein adjacent the radially central portions of said brazing ring; said brazing ring having a V-shaped cross-section trough therein; the bottom of said V-shaped trough entering said groove.

2. An annular brazed seal between a first and second conductive body; said brazed seal including an annular brazing ring interposed between said first and second conductive bodies; at least said first conductive body having an annular groove therein adjacent the radially central portions of said brazing ring; said brazing ring having a V-shaped cross-section trough therein; the bottom of said V-shaped trough entering said groove; said V-shaped trough receiving a solder ring therein; said solder ring being adjacent the surface of said second conductive body.

3. A semiconductor device hermetically sealed housing comprising a copper stud; a semiconductor wafer connected at the center of a surface of said copper stud; a cylindrical insulation housing having a conductive ring extending from one end thereof, and a brazing ring; said brazing ring having one surface thereof connected to one side of said conductive ring; the other surface of said brazing ring being connected to an annular area of said surface of said copper stud surrounding said wafer; said annular area having an empty annular groove therein to reduce the volume of said copper stud in contact with said brazing ring; said brazing ring radially spanning over the top of said annular groove.

4. A semiconductor device hermetically sealed housing comprising a copper stud; a semiconductor wafer connected at the center of a surface of said copper stud; a cylindrical insulation housing having a conductive ring extending from one end thereof, and a brazing ring; said brazing ring having one surface thereof connected to one side of said conductive ring; the other surface of said brazing ring being connected to an annular area of said surface of said copper stud surrounding said wafer; said annular area having an annular groove therein to reduce the volume of said copper stud in contact with said brazing ring; said brazing ring having a V-shaped cross-section trough therein; the bottom of said V-shaped trough entering said groove.

5. A semiconductor device hermetically sealed housing comprising a copper stud; a semiconductor wafer connected at the center of a surface of said copper stud; a cylindrical insulation housing having a conductive ring extending from one end thereof, and a brazing ring; said brazing ring having one surface thereof connected to one side of said conductive ring; the other surface of said brazing ring being connected to an annular area of said surface of said copper stud surrounding said wafer; said annular area having an annular groove therein to reduce the volume of said copper stud in contact with said brazing ring; said brazing ring having a V-shaped cross-section trough therein; the bottom of said V-shaped trough entering said groove; said V-shaped trough receiving a solder ring therein; said solder ring being adjacent the surface of said second conductive body.

References Cited by the Examiner

UNITED STATES PATENTS

| | | | |
|---|---|---|---|
| 2,864,980 | 12/1958 | Mueller et al. | 317—234 |
| 3,015,760 | 1/1962 | Weil | 317—234 |
| 3,024,299 | 3/1962 | Nijhuis et al. | 317—234 X |
| 3,082,347 | 3/1963 | Coolidge | 313—250 |
| 3,199,000 | 8/1965 | Nippert | 317—234 |

ANTHONY BARTIS, *Primary Examiner.*

V. Y. MAYEWSKY, *Assistant Examiner.*